(12) United States Patent
Miethke et al.

(10) Patent No.: US 6,486,036 B1
(45) Date of Patent: Nov. 26, 2002

(54) METHOD AND APPARATUS FOR PROCESS CONTROL OF ALIGNMENT IN DUAL DAMASCENE PROCESSES

(75) Inventors: John C. Miethke, Austin, TX (US); Gregory B. Starnes, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 140 days.

(21) Appl. No.: 09/606,135

(22) Filed: Jun. 28, 2000

(51) Int. Cl.$^7$ ............................................. H01L 21/76
(52) U.S. Cl. ...................... 438/401; 438/401; 438/462; 438/975; 438/16
(58) Field of Search .......................... 257/797; 438/401, 438/12, 14, 15, 16, 18, 462, 975

(56) References Cited

U.S. PATENT DOCUMENTS 6,093,640 A * 7/2000 Hsu et al. ...................... 438/14
6,238,940 B1 * 5/2001 Steffan et al ................... 438/14
6,288,452 B1 * 9/2001 Komuro ...................... 257/797
6,350,548 B1 * 2/2002 Leidy et al. ................. 257/797

* cited by examiner

Primary Examiner—Chandra Chaudhari
Assistant Examiner—David Hogans
(74) Attorney, Agent, or Firm—Williams, Morgan & Amerson, P.C.

(57) ABSTRACT

The present invention is directed to a method of performing alignment during processing of a semiconductor device. The method is comprised of: performing alignment registration on a plurality of layers on said semiconductor device; measuring misregistration of said alignment registration in relation to a predetermined standard alignment key; and generating an offset for a subsequent process layer on said semiconductor using said measure misregistration.

7 Claims, 9 Drawing Sheets

METHOD AND APPARATUS FOR PROCESS CONTROL OF ALIGNMENT IN DUAL DAMASCENE PROCESSES

BACKGROUND OF THE INVENTION

1. Field of the Invention

The present invention is generally related to semiconductor processing, and, more particularly, to process control of alignment in dual damascene processes.

2. Description of the Related Art

A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections. Many modem integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

One particular technique used to form such conductive lines and plugs is known as a dual damascene technique. One variation of this technique involves the formation of a first layer of a dielectric material, formation of a relatively thin etch stop layer (for example comprised of silicon nitride) above the first dielectric layer, patterning of the etch stop layer to define openings corresponding to plugs to be formed in the first dielectric layer, and formation of a second dielectric layer above the etch stop layer. Thereafter, an etching process is used to define an opening in the second dielectric layer, and to remove portions of the first dielectric layer positioned under the openings previously formed in the etch stop layer. The openings in the first and second layers of dielectric material correspond to a yet to be formed metal plug and metal line, respectively. Thereafter, the openings in the first and second dielectric layers are filled with an appropriate metal or layers of metal.

The dual damascene technique is very labor-intensive in that it requires the formation of three process layers, the first and second dielectric layers as well as the etch stop layer. In a typical dual-damascene copper process flow, as shown in FIGS. 1A–1E, a first dielectric layer 100 is deposited on a second dielectric layer 105 on a wafer 107. The second dielectric layer 105 has a "hard mask" (typically silicon nitride, SiN) 110 deposited and patterned thereon, between the first dielectric layer 100 and the second dielectric layer 105. If necessary, the first dielectric layer 100 is planarized using CMP. Metallization patterns are then applied using the hard mask 110 and a patterned photomask 115 (FIG. 1A) and photolithography. Openings (such as trenches 120 and 125) for conductive metal lines, contact holes, via holes, and the like, are etched into both the first dielectric layer 100 and the second dielectric layer 105. The patterned photomask 115 is then stripped (FIG. 1B) and a thin barrier metal layer of tantalum 130A and a copper seed layer 130B are then applied to the entire surface using vapor-phase deposition. The barrier metal layer of tantalum 130A and the copper seed layer 130B blanket-deposit the entire upper surface 135 of the first dielectric layer 100 as well as the side and bottom surfaces of the trenches 120 and 125, forming a conductive surface 140, as shown in FIG. 1C.

The bulk of the copper trench-fill is again done using an electroplating technique, where the conductive surface 140 is mechanically clamped to an electrode to establish an electrical contact, and the wafer 107 is then immersed in an electrolyte solution containing copper ions. An electrical current is then passed through the wafer-electrolyte system to cause reduction and deposition of copper on the conductive surface 140.

This process typically produces a conformal coating 145 of constant thickness across the entire conductive surface 140, as shown in FIG. 1D. Once a sufficiently thick layer of copper 145 has been deposited, the surface of the wafer is planarized using CMP techniques. Ideally, this clears all copper and tantalum barrier metal from the entire upper surface 135 of the first dielectric layer 100, leaving copper only in the copper-filled trenches (such as copper-filled trenches 150 and 155), as shown in FIG. 1E.

The dual-damascene copper process flow, as shown in FIGS. 1A–1E, combines the intermetal via connection formation with the copper trench-fill deposition by etching a more complex pattern before the barrier metal layer and copper seed layer depositions and before the copper trench-fill. The trench etching continues until the via hole (such as trench 125 in FIG. 1B) has been etched out. The dual-damascene copper process flow, as compared to other processes such as the signal-damascene process, significantly reduces the number of processing steps and is typically a preferred method of achieving copper metallization.

Typically, in dual-damascene processes, at least two alignment registrations processes define an alignment from one process layer to the next process layer. In contrast, in single-damascene processes, one alignment registration process can define an alignment from one process layer to another. Alignment misregistration in dual-damascene processes can cause significant reduction in the quality of the processed semiconductor devices.

The present invention is directed to a method and device for solving some or all of the aforementioned problems.

SUMMARY OF THE INVENTION

In one aspect of the present invention, a method is provided for performing alignment during processing of a semiconductor device. The method is comprised of: performing alignment registration on a plurality of layers on said semiconductor device; measuring misregistration of said alignment registration in relation to a predetermined standard alignment key; and generating an offset for a subsequent process layer on said semiconductor using said measure misregistration.

In one aspect of the present invention, an apparatus is provided for performing alignment during processing of a semiconductor device. The apparatus of the present invention comprises: means for performing alignment registration on a plurality of layers on said semiconductor device; means for measuring misregistration of said alignment registration in relation to a predetermined standard alignment key; and means for generating an offset for a subsequent process layer on said semiconductor using said measure misregistration.

BRIEF DESCRIPTION OF THE DRAWINGS

The invention may be understood by reference to the following description taken in conjunction with the accompanying drawings, in which like reference numerals identify like elements, and in which.

Figure 1A:
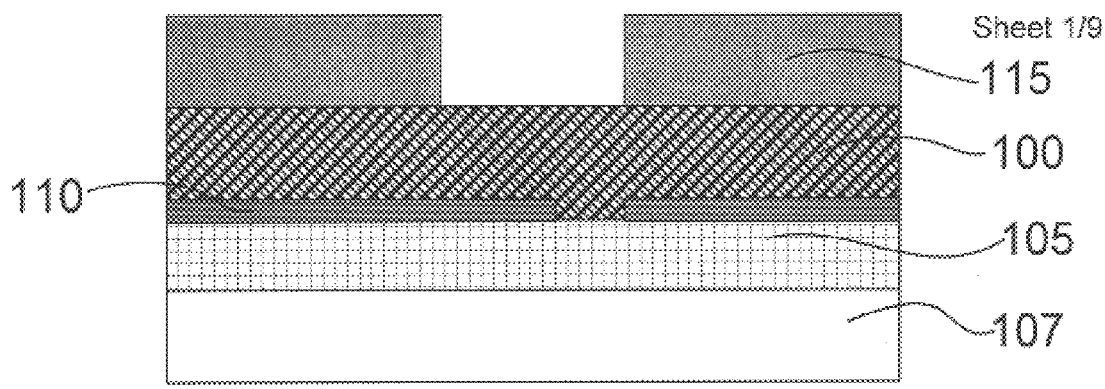
FIGS. 1A–1E illustrate a conventional dual-damascene copper process flow as utilized by the present invention.
Figure 1B:
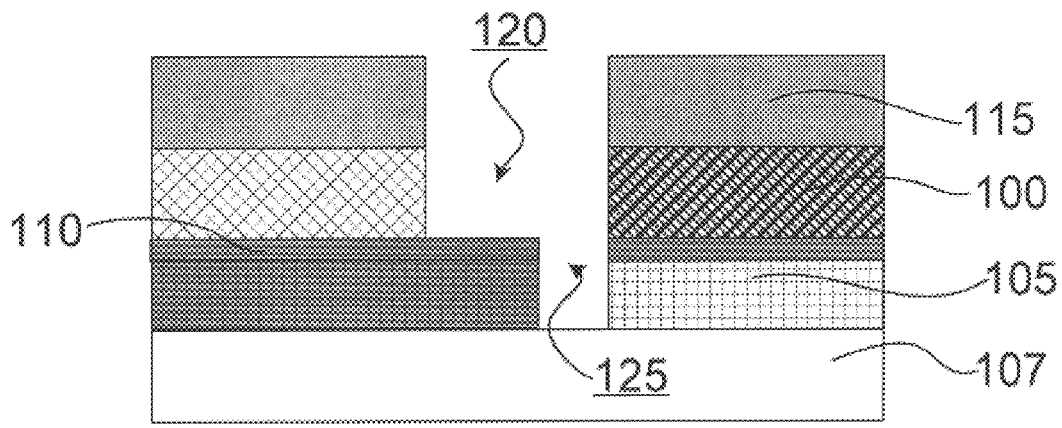
Figure 1C:
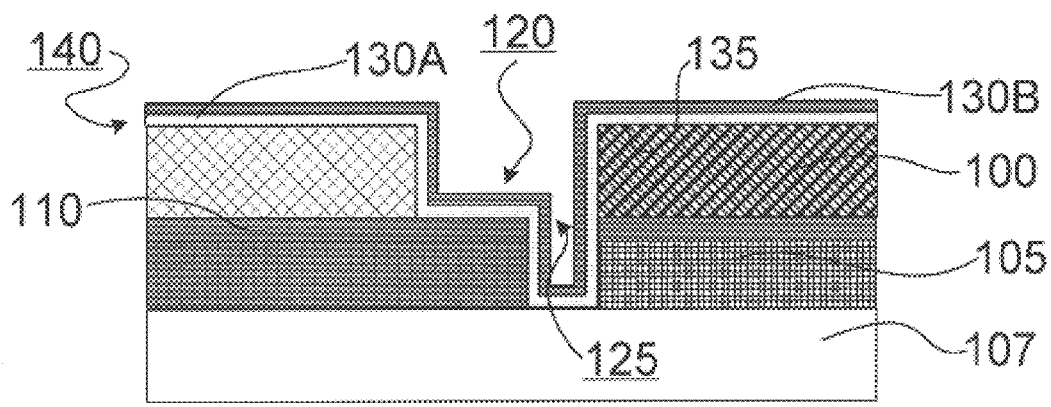
Figure 1D:
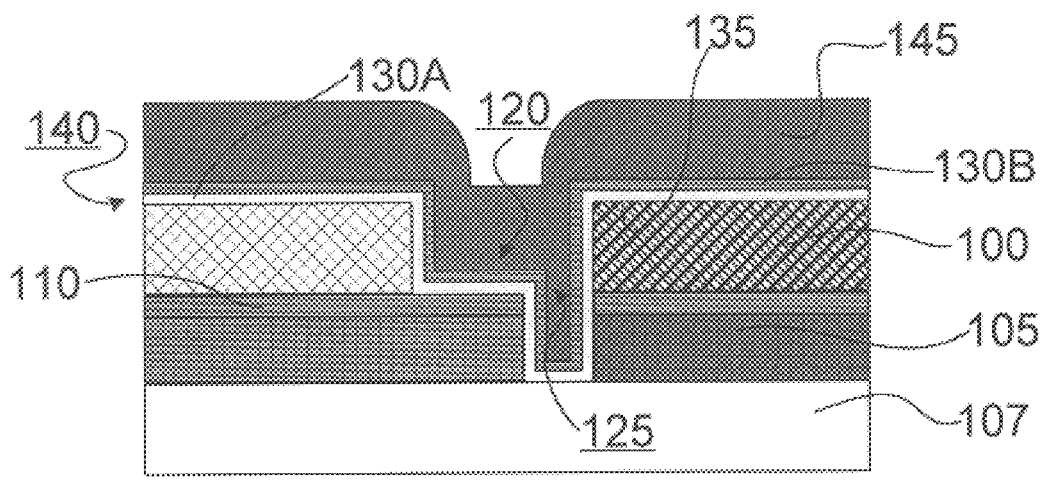
Figure 1E:
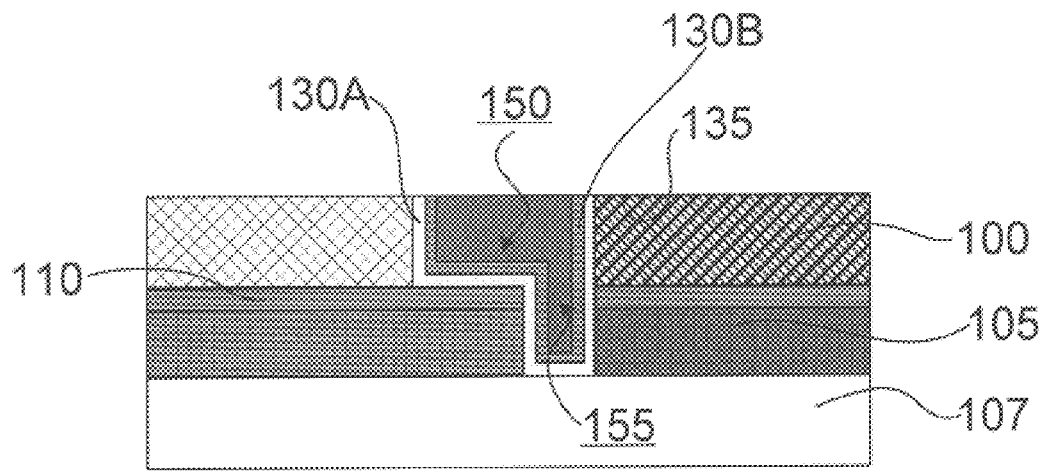

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. One such production data is the registration data associated with dual-damascene processes. The present invention discloses a method and apparatus for performing offset adjustments in a dual-damascene process based upon previous registration data. More specifically, the present invention teaches a method and apparatus for acquiring registration data associated with at least the first two process layers of a dual-damascene process and using the acquired data to offset a third processing step that results in forcing the overall alignment in one direction.

Figure 2:
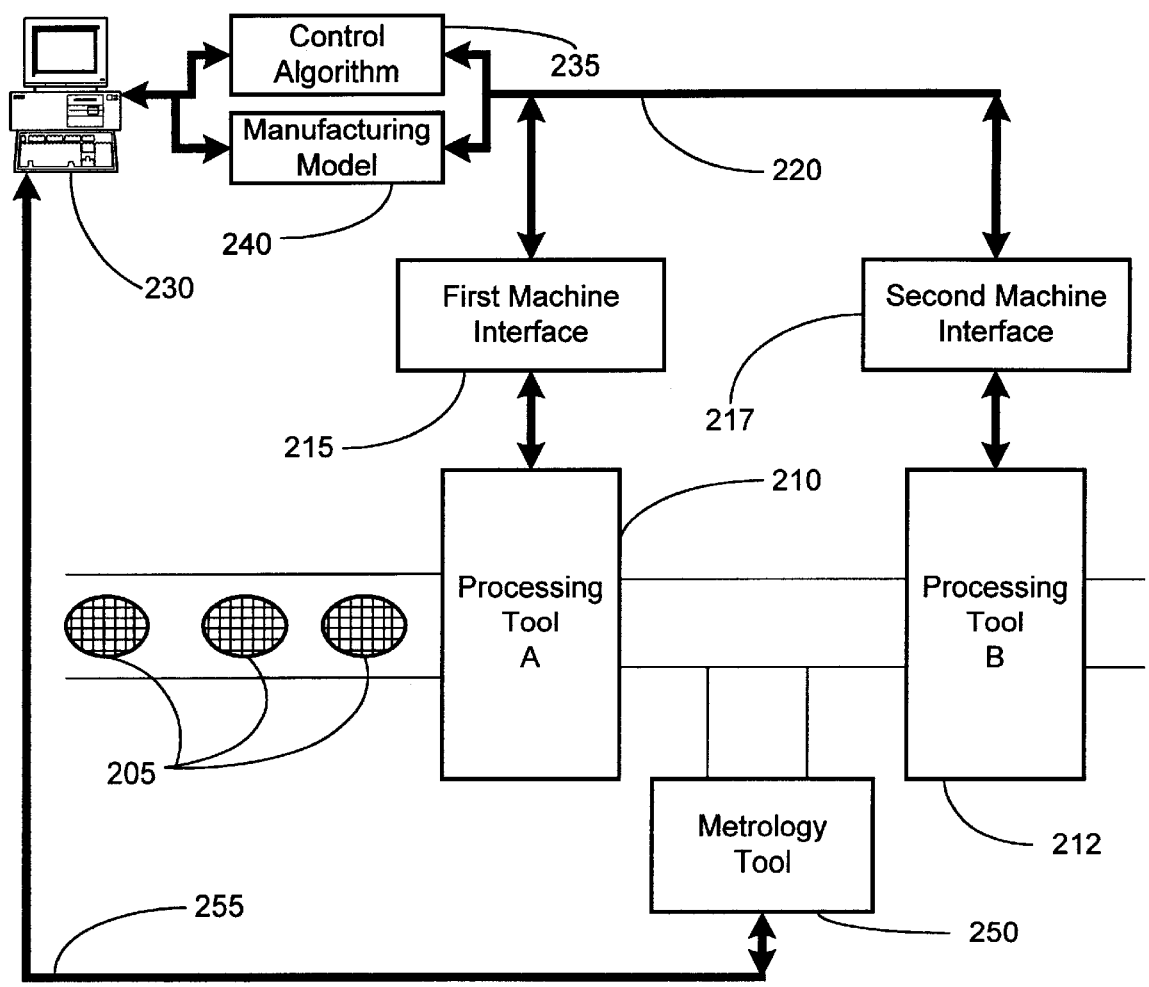
FIG. 2 illustrates one embodiment of the apparatus for implementing the method taught by present invention.

Turning now to FIG. 2, one embodiment of the present invention is illustrated. In one embodiment, semiconductor products 205, such as semiconductor wafers are processed on processing tools 210, 212 using a plurality of control input signals on a line 220. In one embodiment, the control input signals on the line 220 are sent to the processing tools 210, 212 from a computer system 230 via machine interfaces 215, 217. In one embodiment, the first and second machine interfaces 215, 217 are located outside the processing tools 210, 212. In an alternative embodiment, the first and second machine interfaces 215, 217 are located within the processing tools 210, 212.

In one embodiment, the computer system 230 sends control input signals on the line 220 to the first and second machine interfaces 215, 217. The computer system 230 employs a manufacturing model 240 to generate the control input signals on the line 220. A control algorithm 235, which in one embodiment is a computer software program, is utilized by the computer system 230 to control the manufacturing processes performed by the processing tools 210, 212. In one embodiment, the control algorithm 235 is integrated into the computer system 230.

In one embodiment, the manufacturing model 240 defines a process script and input control that implement a particular manufacturing process. The control signals on the line 220 that are intended for the processing tool A 210 are received and processed by the first machine interface 215. The control input signals on the line 220 that are intended for the processing tool B 212 are received and processed by the second machine interface 217. Examples of the processing tools 210, 212 used in semiconductor manufacturing processes are steppers and etch process tools. In one embodiment, the processing tool A 210 is a standard etch process tool and the processing tool B 212 is a secondary etch process tool.

A metrology tool 250, such as a registration alignment measurement tool, is employed in the semiconductor device manufacturing system illustrated in FIG. 2. In one embodiment, the metrology tool 250 is capable of performing registration alignment, such as alignment of copper traces, measurements on semiconductor products 205 that are processed by the processing tools 210, 212. In one embodiment, data from the metrology tool 250 is sent, on a line 255, to the computer system 230, which in one embodiment is part of a process control system (not shown), such as an APC system. In one embodiment, the computer system 230, utilizing the control algorithm 235, is capable of making adjustment to the manufacturing processes performed by the processing tools 210, 212 in response to the data acquired by the metrology tool 250.

Figure 3:
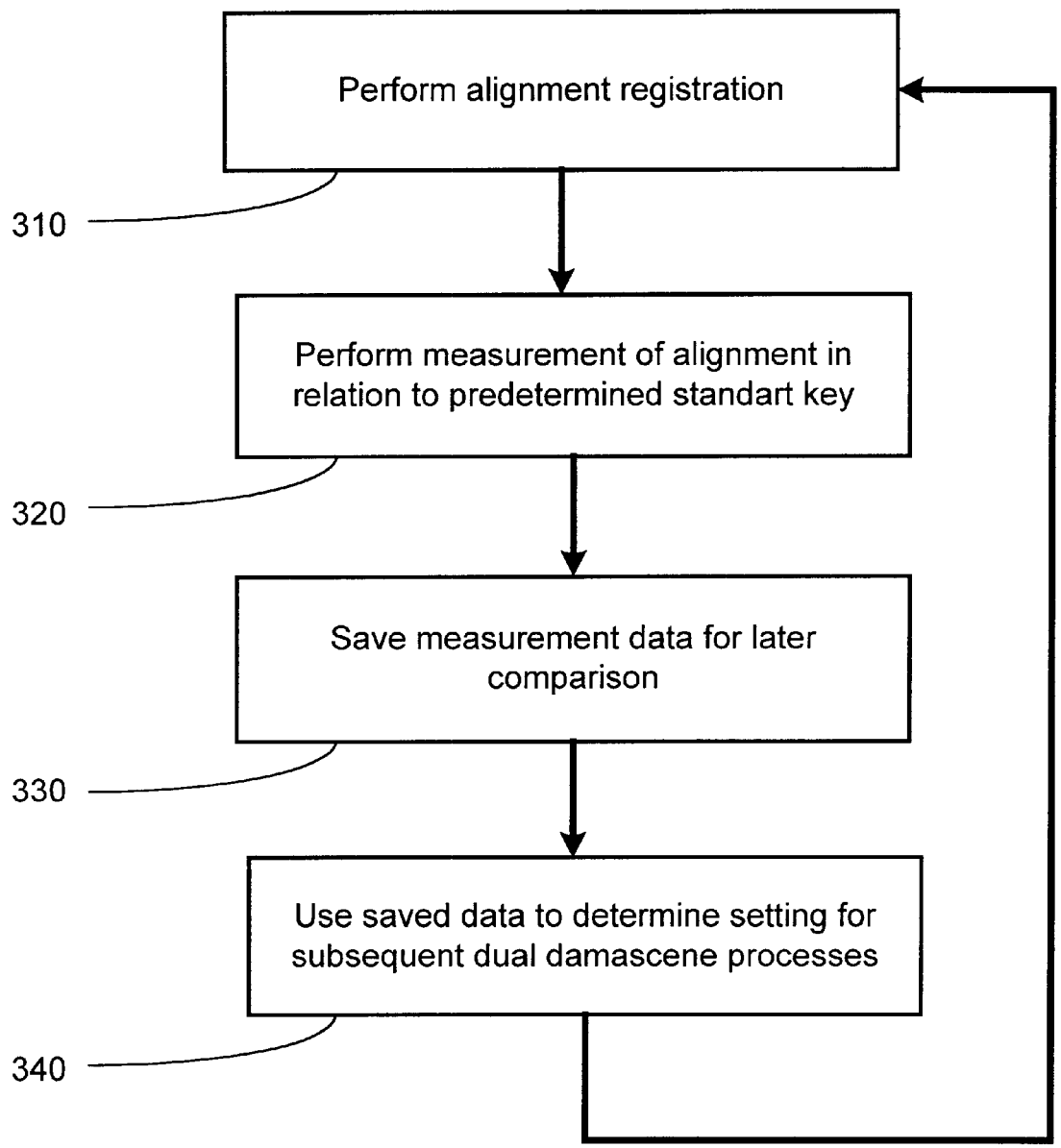
FIG. 3 illustrates one embodiment of the method of generating an offset for control adjustments for a process layer in a dual damascene process, as taught by the present invention.

Turning now to FIG. 3, one embodiment of the method taught by the present invention is illustrated. FIG. 3 illustrates an inventive method of generating an offset adjustment for a third layer of a dual damascene process being performed upon a semiconductor device, based upon manufacturing data acquired from the processing of a first processed layer and a second processed layer. Generally, at least two alignment registrations are used to define the amount of alignment from one processed layer to another in a semiconductor device being processed. In one embodiment, the alignment registration relates to corresponding copper structures that are deposited on two layers in a semiconductor device.

An alignment registration check is performed upon two layers of a semiconductor device upon which a dual damascene process is performed, as described in block 310 of FIG. 3. In one embodiment, the registration of copper deposited on a first layer and a second layer on a semiconductor wafer is measured. Generally, a certain amount of misregistration can be tolerated, depending upon the accuracy required for a particular semiconductor device being manufactured. In other words, for more precise semiconductor devices, tighter tolerances for misregistration of material between semiconductor process layers are employed.

The registration data acquired from the alignment check is generally made in relation to a standard key that contains predetermined registration data, as described in block 320 of FIG. 3. In other words, a standard key that contains acceptable registration data for a particular process layer is used to determine the amount of misregistration that occurred in that process layer. The registration data is then stored into a database (not shown) for comparison with later processed semiconductor layers, as described in block 330 of FIG. 3. In one embodiment, the registration data is stored in the memory of the computer system 230. In one embodiment, the database is accessible by a process control system, such as the APC framework.

The stored registration data is used to determine the control settings for subsequent dual damascene processes, as described in block 340 of FIG. 3. The misregistration between two dual-damascene processed layers is used to determine an offset for the third layer to compensate for the misregistration between the first two processed layers. The third dual-damascene layer is then processed using the new offset that are implemented by the modified control input parameters that control the dual-damascene process. In one embodiment, the computer system 230 uses the control algorithm 235 to modify control input signals defined in the manufacturing model 240, thereby modifying the input signals that control subsequent dual damascene processes.

Figure 4:
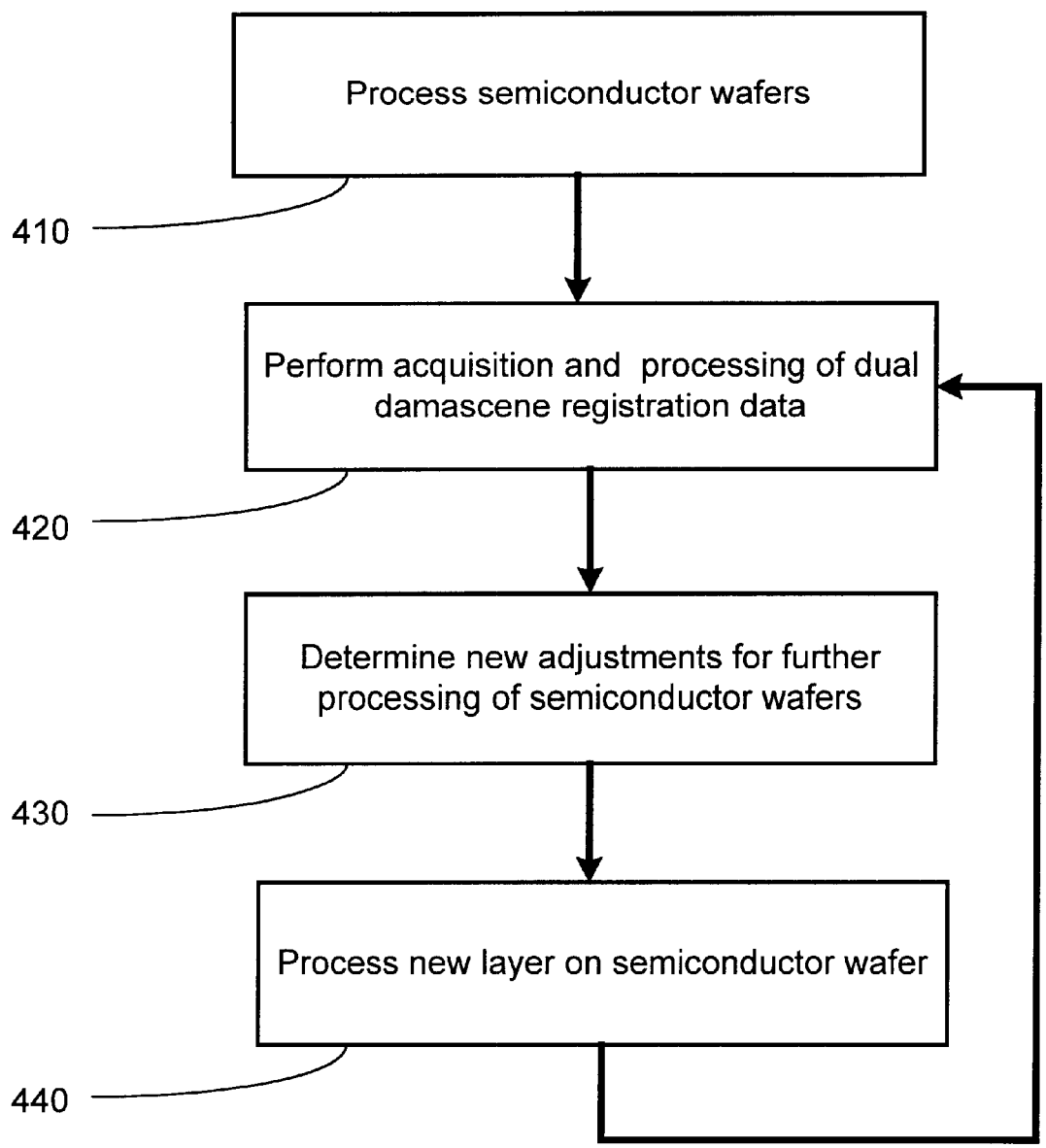
FIG. 4 illustrates a more detailed depiction of the steps generating an offset for control adjustments for a process layer in a dual damascene process, described in FIG. 3.

Turning now to FIG. 4, a detailed depiction of the methods taught by the present invention is illustrated. In one embodiment, a semiconductor device, such as a semiconductor wafer is processed, as described in block 410 of FIG. 4. In one embodiment, a dual-damascene process is performed on the semiconductor wafer. Acquisition and processing of dual damascene registration data is performed, as described in block 420 of FIG. 4. A more detailed depiction of the process of performing acquisition and processing of dual damascene registration data is illustrated in FIG. 5.

Figure 5:
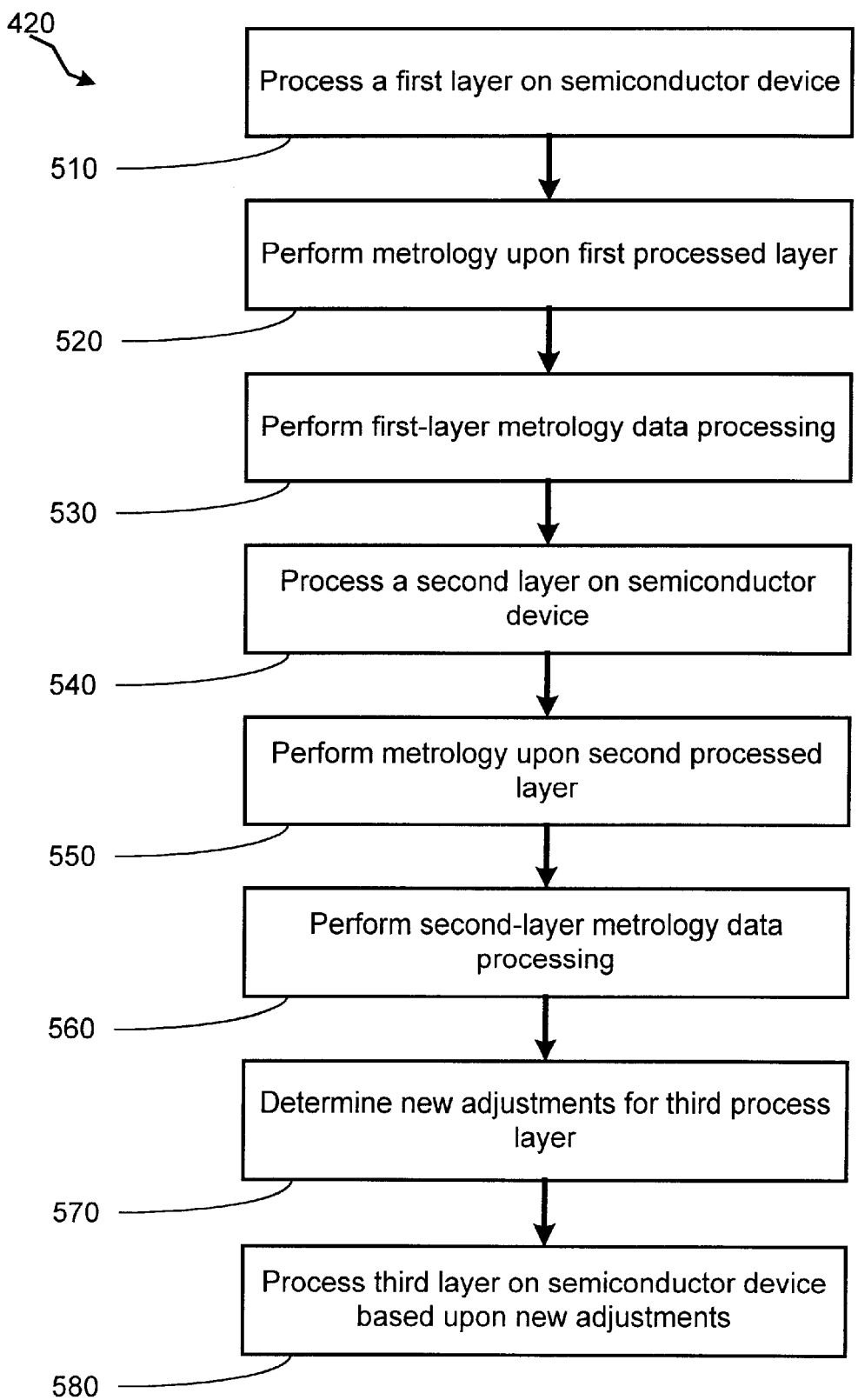
FIG. 5 illustrates a more detailed depiction of the process of performing acquisition and processing of dual damascene registration data described in FIG. 4.

Turning now to FIG. 5, a first layer is processed on a semiconductor device, such as a semiconductor wafer, as described in block 510 of FIG. 5. In one embodiment, the processing of the first layer includes the step of copper deposition on the semiconductor wafer. In one embodiment, the processing of the first layer is performed by the processing tool A 210. Once the first layer is processed, metrology data related to the processing of the first layer is acquired, as described in block 520 of FIG. 5. In one embodiment, the metrology data is acquired using the metrology tool 250.

Figure 6:
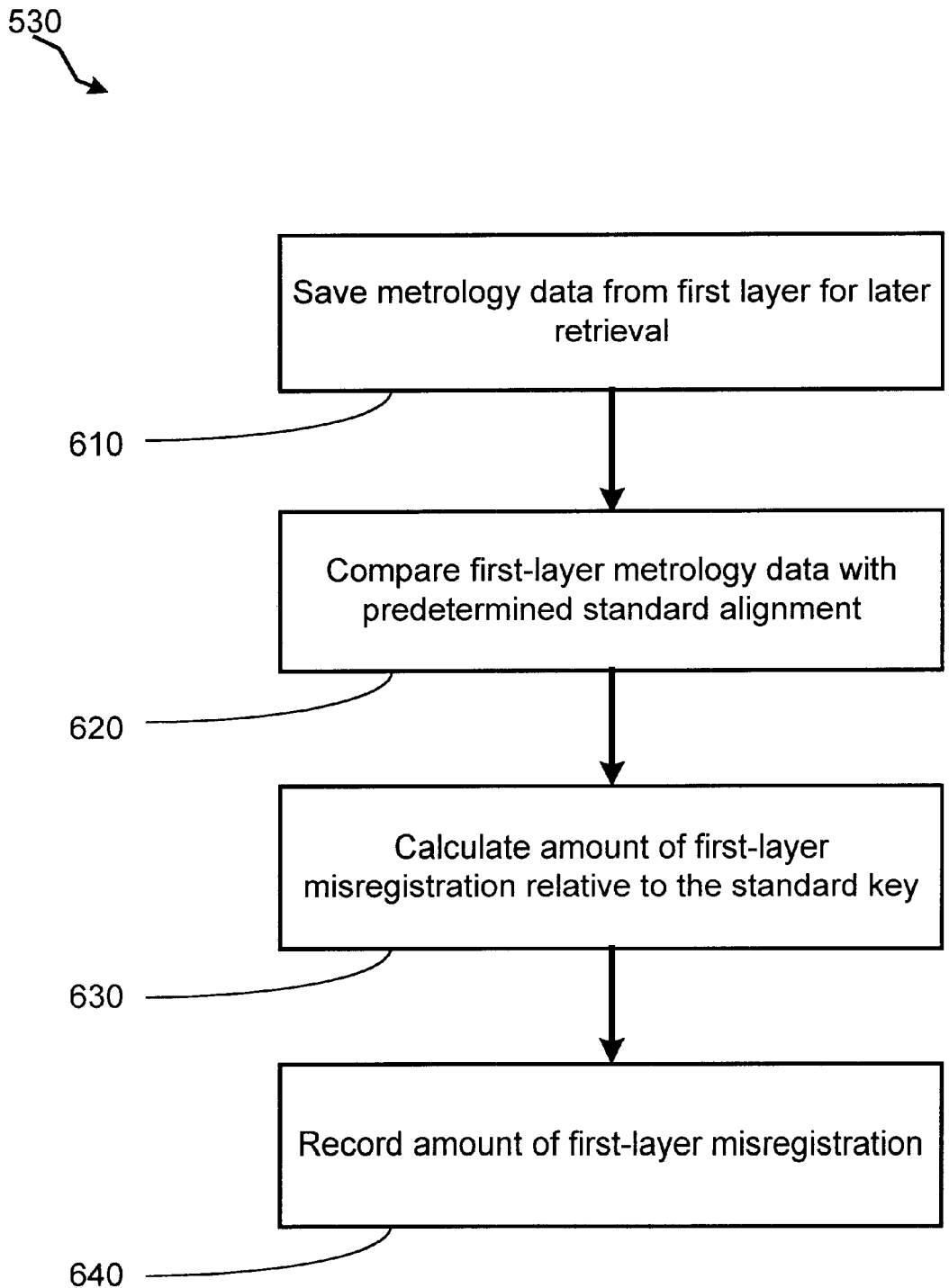
FIG. 6 illustrates a more detailed depiction of the steps of performing the first-layer metrology data processing described in FIG. 5.

Once metrology data relating to the processing of the first-layer is acquired, a first-layer metrology data processing step is performed, as described in block 530 of FIG. 5. A more detailed depiction of the steps of performing the first-layer metrology data processing is illustrated in FIG. 6. Turning now to FIG. 6, metrology data from the first processed layer is saved for later retrieval, as described in block 610 of FIG. 6. In one embodiment, metrology data from the first processed layer is saved in the memory (not shown) of the computer system 230. In one embodiment, the metrology data from the first processed layer is compared with a predetermined standard alignment data set, as described in block 620.

Measurement data from the metrology data is used to calculate the amount of misregistration relative to a predetermined standard registration key, in the first processed layer, as described in block 630 of FIG. 6. The standard registration key contains tolerances definitions that can vary from one semiconductor process type to another, and are known by those skilled in the art. Once the amount of misregistration relative to the predetermined standard registration key in the first processed layer is calculated, the amount of misregistration is stored for later retrieval, as described in block 640 of FIG. 6. In one embodiment, the misregistration data for the first processed layer is stored in the memory of the computer system 230. The completion of the step of storing misregistration data described in block 640 concludes the step of performing first-layer metrology data processing described in block 530 of FIG. 5.

Turning back to FIG. 5, once the step of first-layer metrology data processing is substantially complete, a second layer on the semiconductor device is processed, as described in block 540 of FIG. 5. In one embodiment, the processing of the second layer includes the step of copper deposition on the semiconductor wafer. In one embodiment, the processing of the second layer is performed by the processing tool B 212. Once the second layer is processed, metrology data related to the processing of the second layer is acquired, as described in block 550 of FIG. 5. In one embodiment, the metrology data is acquired using the metrology tool 250.

Figure 7:
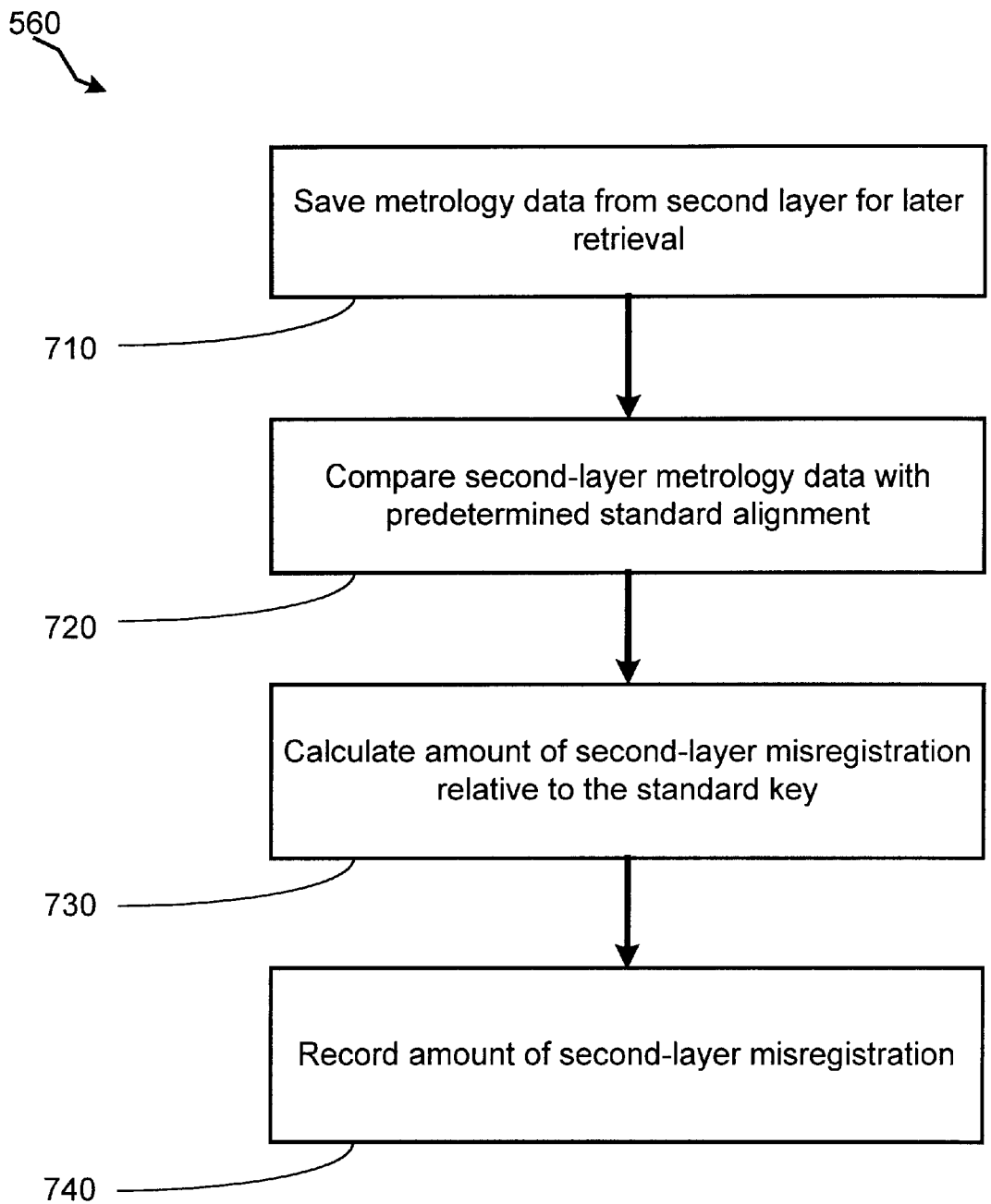
FIG. 7 illustrates a more detailed depiction of the steps of performing the second-layer metrology data processing described in FIG. 5.

Once metrology data relating to the processing of the second layer is acquired, a second-layer metrology data processing step is performed, as described in block 560 of FIG. 5. A more detailed depiction of the steps of performing the second-layer metrology data processing is illustrated in FIG. 7. Turning now to FIG. 7, metrology data from the second processed layer is saved for later retrieval, as described in block 710 of FIG. 7. In one embodiment, metrology data form the second processed layer is saved in the memory (not shown) of the computer system 230. In one embodiment, the metrology data from the second processed layer is compared with a predetermined standard alignment data set, as described in block 720.

Measurement data from the metrology data is used to calculate the amount of misregistration relative to a predetermined standard registration key, in the second processed layer, as described in block 730 of FIG. 7. The standard registration key contains tolerances definitions that can vary from one semiconductor process type to another, and are known by those skilled in the art. Once the amount of misregistration relative to the predetermined standard registration key in the second processed layer is calculated, the amount of misregistration is stored for later retrieval, as described in block 740 of FIG. 7. In one embodiment, the misregistration data for the second processed layer is stored in the memory of the computer system 230. The completion of the step of storing misregistration data described in block, 740 concludes the step of performing second-layer metrology data processing described in block 560 of FIG. 5.

Turning back to FIG. 5, once the step of first-layer and second-layer metrology data processing is substantially complete, new adjustments for a third process layer in the dual damascene process are determined, as described in block 570 of FIG. 5. In one embodiment, the stored misregistration data for the first processed layer and the second processed layer is retrieved. The stored misregistration data is used to calculate an offset for the third process layer. In one embodiment, a process control system, such as the APC framework, retrieves the misregistration data and calculates the offset for the third process layer using the computer system 230.

In one embodiment, the offset for the third process layer is designed to correct the misregistration errors that occurred in the first process layer and the second process layer during the dual damascene process. Generally, the offset for the third process layer causes the overall dual damascene alignment to move towards a single direction such that a proper connection is reached between the three process layers of the dual damascene process. In one embodiment, the amount of offset calculated for the third process layer in the dual damascene process is reflected in the control algorithm 235. The control algorithm 235 then modifies the control input signal used by the manufacturing model 240 to implement the control modifications required to create the calculated offset for the third process layer in the dual damascene process. Once the new adjustment that reflects the offset for the third process layer in the dual damascene process is determined, the third process layer on the semiconductor device is processed, as described in block 580 of FIG. 5. In one embodiment, the third process layer is processed using control signals that reflect the new offset calculated to produce a trio of dual damascene layers that are electrically connected within acceptable industry tolerances.

Figure 8:
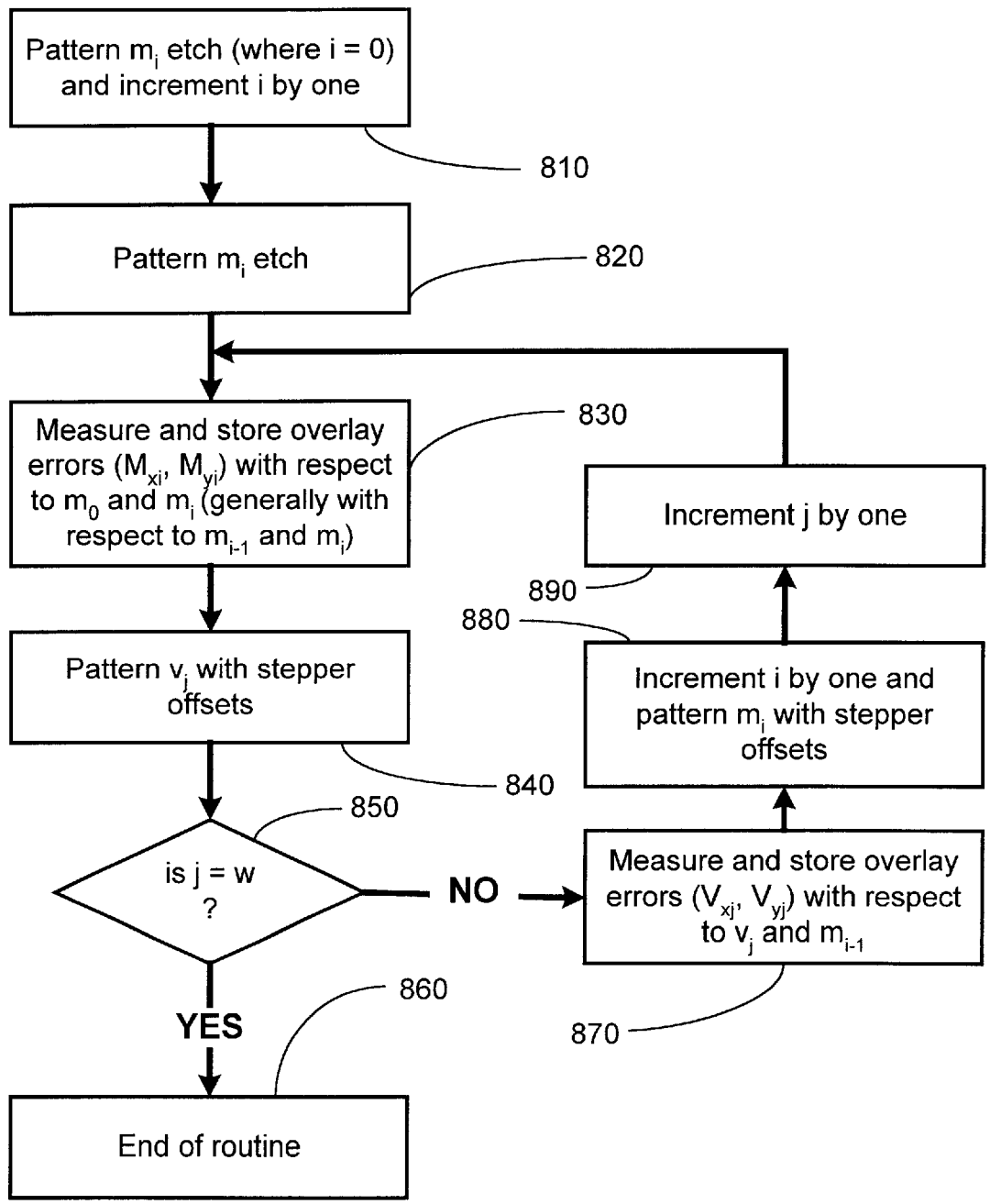
FIG. 8 illustrates one embodiment of a flowchart depiction of an algorithm for performing the methods taught by the present invention.

Turning now to FIG. 8, a flowchart depiction of one embodiment of an algorithm for performing dual damascene alignment in accordance with the present invention, is illustrated. A baseline metal, $m_0$ ($m_i$, wherein "i" is an integer that is initially equal to zero and is incremented by one), is patterned onto a semiconductor wafer that is being manufactured, as described in block 810 of FIG. 8. Subsequently, a next metal patterning step, $m_i$, is implemented onto the manufacturing semiconductor wafer, as described in block 820 of FIG. 8. Using the methods described above, overlay errors in previous metal patterning processes ($M_{xi}$, $M_{yi}$, where $M_{xi}$ is the overlay error in the x-coordinate and $M_{yi}$ is the overlay error in the y-coordinate during the metal patterning processes) are measured and stored, as described in block 830 of FIG. 8. The overlay errors ($M_{xi}$, $M_{yi}$) are calculated with respect to the processes $m_i$ and $m_{i-1}$ (i.e. the previous two metal patterning processes).

Using the dual damascene methods described above, a via is patterned into the semiconductor wafer being processed, as described in block 840 of FIG. 8. The term $v_j$ represents the via patterning process, where j is an integer. The via patterning process, $v_j$, is performed using a stepper offset function that is defined by Equation 1:

$$\text{Stepper offset} = \alpha(i\ M_{xi}, M_{yi}) \quad \text{Equation 1};$$

where $\alpha$ is a predetermined weighted constant multiplier of via stepper offsets.

Once the via patterning process, $v_j$, is performed, as described in block 850 of FIG. 8, a determination is made whether the integer "j", which represents the numerical value of the current via patterning process step, is equal to "ω", which represents the numerical value of the last via patterning process step. When a determination is made that "j" is equal to "ω" (i.e. the current via patterning process step is the last via patterning process step), the algorithm for performing dual damascene alignment in accordance with the present invention is terminated, as described in block 860 of FIG. 8.

When a determination is made that "j" is not equal to "ω" (i.e. the current via patterning process step is not the last via patterning process step), the measurement step described in block 870 of FIG. 8 is implemented. Using the methods described above, overlay errors in the previous via patterning processes ($V_{xj}$, $V_{yj}$, where $V_{xy}$ is the overlay error in the x-coordinate and $V_{yj}$ is the overlay error in the y-coordinate during the via patterning processes) are measured and stored, as described in block 870 of FIG. 8. The overlay errors ($V_{xj}$, $V_{yj}$) are calculated with respect to the processes $v_j$ and $m_{i-1}$ (i.e. the current via patterning process and the previous metal patterning process).

Once the overlay errors associated with the via patterning steps are calculated and stored, the numerical value of the current metal patterning processing step, "i", is incremented by one and a subsequent metal patterning process step is executed, as described in block 880 of FIG. 8. The metal patterning process, $m_i$, is performed using a stepper offset function that is defined by Equation 2:

$$\text{Stepper offset} = \beta(V_{xy}, V_{yj}) \quad \text{Equation 2};$$

where $\beta$ is a predetermined weighted constant multiplier of metal stepper offsets.

Subsequently, the numerical value associated with the current via patterning process, "j", is incremented by one, as described in block 890 of FIG. 8. With the respective numerical values of the current metal patterning processing step and the current via patterning step incremented, the next set of metal and via processing steps are executed, as illustrated in FIG. 8. The steps described in blocks 830, 840, 850, 870, 880, and 890 of FIG. 8 are repeated until the algorithm described in FIG. 8 is terminated according to block 870. In other words, the process of measuring the overlay errors and patterning subsequent via and metal patterns are repeated until "j" is equal to "ω" (i.e. the current via processing step is the last via processing step), at which time the routine described in FIG. 8 is terminated. Other routines can be utilized by those skilled in the art and have benefit of the present disclosure, in order to implement the teachings of the present invention.

The principles taught by the present invention can be implemented in an Advanced Process Control (APC) Framework. The APC is a preferred platform from which to implement the overlay control and etch process control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of performing alignment during a dual damascene processing of a semiconductor device, comprising:

performing alignment registration on a plurality of layers on said semiconductor device in response to said dual damascene processing;

measuring misregistration of said alignment registration in relation to a predetermined standard alignment key; and generating an offset for a subsequent process layer on said semiconductor using said measured misregistration to create a connection for a via related to said dual damascene process.

2. The method described in claim 1, wherein performing alignment registration on a plurality of layers during a dual damascene process further comprises performing registration of copper upon a plurality of process layer on said semiconductor device.

3. The method described in claim 1, wherein performing alignment during processing of a semiconductor device further comprises:

processing a first layer on said semiconductor device;

performing metrology upon said processed first layer;

performing a first-layer metrology data processing using data acquired from said metrology of said processed first layer;

processing a second layer on said semiconductor device;

performing metrology upon said processed second layer;

performing a second-layer metrology data processing using data acquired from said metrology of said processed second layer;

determining at least one new adjustment for a third process layer using said first-layer metrology data processing and said second-layer metrology data processing; and processing said third process layer using at least one of said new adjustment for said third process layer.

4. The method described in claim 3, wherein performing a first-layer metrology data processing further comprises:

storing metrology data from a first processed layer;

comparing said stored metrology data to a predetermined standard alignment;

calculating a first-layer misregistration using said comparison of metrology data to said predetermined standard alignment; and storing said first-layer misregistration data.

5. The method described in claim 3, wherein performing a second-layer metrology data processing further comprises:

storing metrology data from a second processed layer;

comparing said stored metrology data to a predetermined standard alignment;

calculating a second-layer misregistration using said comparison of metrology data to said predetermined standard alignment; and storing said second-layer misregistration data.

6. The method described in claim 3, wherein determining at least one new adjustment for a third process layer further comprises calculating an offset registration value for compensating for said first-layer misregistration and said second-layer misregistration.

7. An apparatus for performing alignment during processing of a semiconductor device, comprising:

means for performing alignment registration on a plurality of layers on said semiconductor device in response to said dual damascene processing;

means for measuring misregistration of said alignment registration in relation to a predetermined standard alignment key; and means for generating an offset for a subsequent process layer on said semiconductor using said measured misregistration to create a connection for a via related to said dual damascene process.

* * * * *